United States Patent
Chakraborty (10) Patent No.: US 7,673,224 B2
(45) Date of Patent: Mar. 2, 2010

(54) LOW POWER VITERBI DECODER USING A NOVEL REGISTER-EXCHANGE ARCHITECTURE

(75) Inventor: Tuhin Subhra Chakraborty, West Bengal (IN)

(73) Assignee: Agere Systems Inc., Allentown, PA (US)

( * ) Notice: Subject to any disclaimer, the term of this patent is extended or adjusted under 35 U.S.C. 154(b) by 841 days.

(21) Appl. No.: 11/519,287

(22) Filed: Sep. 12, 2006

(65) Prior Publication Data
US 2008/0072127 A1    Mar. 20, 2008

(51) Int. Cl.
    H03M 13/41    (2006.01)
(52) U.S. Cl. ..................................................... 714/795
(58) Field of Classification Search .................. 714/795
    See application file for complete search history.

(56) References Cited

U.S. PATENT DOCUMENTS

| | | | | |
|---|---|---|---|---|
| 3,789,360 | A * | 1/1974 | Clark et al. .................. | 714/792 |
| 4,536,878 | A * | 8/1985 | Rattlingourd et al. ....... | 714/795 |
| 4,715,037 | A * | 12/1987 | Yagi ........................... | 714/795 |
| 5,488,637 | A * | 1/1996 | Jeong et al. ................. | 375/341 |
| 5,509,021 | A * | 4/1996 | Todoroki .................... | 714/795 |
| 6,041,433 | A * | 3/2000 | Kamada ...................... | 714/795 |
| 6,084,925 | A * | 7/2000 | Baek ........................... | 375/341 |
| 6,192,502 | B1 * | 2/2001 | Yamaguchi et al. ......... | 714/795 |
| 6,598,205 | B1 * | 7/2003 | Luetkemeyer ............... | 714/795 |
| 6,615,388 | B1 * | 9/2003 | Takamichi ................... | 714/795 |
| 6,647,530 | B1 * | 11/2003 | Kamada ...................... | 714/792 |
| 6,651,215 | B2 * | 11/2003 | Miyauchi et al. ............ | 714/795 |
| 6,725,418 | B2 * | 4/2004 | Sawaguchi et al. .......... | 714/795 |
| 6,748,034 | B2 * | 6/2004 | Hattori et al. ................ | 375/341 |
| 7,000,175 | B2 | 2/2006 | Azadet et al. ............... | 714/794 |
| 7,120,855 | B2 * | 10/2006 | Chen et al. ................... | 714/795 |
| 2005/0264906 | A1 | 12/2005 | Haratsch ....................... | 360/39 |
| 2005/0268210 | A1 | 12/2005 | Ashley et al. ............... | 714/792 |
| 2006/0174183 | A1 | 8/2006 | Ashley et al. ............... | 714/792 |

OTHER PUBLICATIONS

"A 500-Mb/s Soft-Output Viterbi Decoder," by Engling Yeo, Student Member, IEEE, et al., IEEE Journal of Solid-State Circuits, vol. 38, No. 7, Jul. 2003, pp. 1234-1240.

(Continued)

Primary Examiner—Stephen M Baker
(74) Attorney, Agent, or Firm—Mendelsohn, Drucker & Associates, P.C.; Steve Mendelsohn (57) ABSTRACT

An apparatus and method of reducing power dissipation in a register exchange implementation of a Viterbi decoder used in a digital receiver or mass-storage system without degrading the bit error rate of the decoder, by selectively inhibiting data samples in the Viterbi decoder's register memory from being shifted if the data samples have converged to a single value. FIFO memories keep track of what data samples have converged, the order of the samples, and the converged data value, thereby keeping the decoded data in the FIFO synchronized with data continuing to be shifted through the register memory.

24 Claims, 5 Drawing Sheets

OTHER PUBLICATIONS

"The Viterbi Algorithm," by G. David Forney, Jr., Invited Paper, Proceedings of The IEEE, vol. 61, No. 3, Mar. 1973, pp. 268-278.

"Maximum-Likelihood Sequence Estimation of Digital Sequences in the Presence of Intersymbol Interference," by G. David Forney, Jr., Member, IEEE, IEEE Transactions on Information Theory, vol. IT-18, No. 3, May 1972, pp. 363-378.

"High-Speed VLSI Architectures for Soft-Output Viterbi Decoding," by Olaf Joeressen, et al., RWTH Aachen (Aachen University of Technology), ERT 5240, Templergraben 55, 5100 Aachen, Germany, 1992, pp. 373-384.

"Advanced Read Channels for Magnetic Disk Drives," by Thomas D. Howell, et al., IEEE Transactions on Magnetics, vol. 30, No. 6, Nov. 1994, Quantum Corp., Milpitas, CA, pp. 3807-3812.

"Reconfigurable Viterbi Decoder for Mobile Platform," by Rizwan Rasheed, Mobile Communications Department, Institut Eurecom, et al., 6 pages.

* cited by examiner

LOW POWER VITERBI DECODER USING A NOVEL REGISTER-EXCHANGE ARCHITECTURE

FIELD OF THE INVENTION

This invention relates to data communication systems and mass-storage systems and, more particularly, to apparatus and methods for implementing a Viterbi decoder in said systems.

BACKGROUND OF THE INVENTION

Convolutional codes, used for encoding data for transmission or for storage, are used in high-performance digital communication systems, such as cellular telephone systems, and high areal data density magnetic mass-storage systems, such as hard-disk drives. Recovery of the encoded data after transmission or from a magnetic disk system falls to a type of decoder that implements a form of the Viterbi algorithm (VA), referred to generally as a Viterbi decoder (VD). The Viterbi decoder is a complex device that, without high-density very large-scale integrated circuit (VLSI) technology to implement the Viterbi decoder, modern digital cellular telephones, and battery operated computers and mp3 players with hard-disk drives would not be practical. For a detailed description of the Viterbi algorithm, see "Viterbi Algorithm," by G. Forney, Jr., *Proceedings of the IEEE*, vol. 61, no. 3, pp. 268-278, March 1973, hereby incorporated by reference in its entirety.

VDs are also widely used to detect data in the presence of intersymbol interference (ISI), such as in mass-storage systems and bandwidth-limited high-speed communication channels. See "Maximum-Likelihood Sequence Estimation of Digital Sequences in the Presence of Intersymbol Interference," by G. Forney, Jr., *IEEE Transactions on Information Theory*, Vol. IT-18, No. 3, pp. 363-378, May 1972, hereby incorporated by reference in its entirety.

There are two basic forms of the VA: 1) trace-back (TB) and 2) register-exchange (RE). Both algorithms produce "decoded" data based on a probabilistic estimation of received data symbols by knowing a priori the convolution code used to encode the data. The TB version, which retraces the data estimates back in time to find the most likely sequence (path) of encoding for a given received data symbol, allows for small, power efficient VD implementations at the cost of slow speed. The RE version (referred to herein as the RE architecture), which processes a predetermined number of data estimates in parallel such that the estimates merge to a most likely value, is the fastest, least latent, VD implementation. The RE architecture uses commonly clocked flip-flop registers instead of area-efficient random-access memories. Concomitant with the low latency is high power dissipation because all the registers are clocked simultaneously with each clock cycle. It is understood that, for purposes here, the foregoing descriptions of the various forms of VA and the implementations thereof are greatly simplified. For a more detailed description of the TB and RE forms of the VA, see "A 500-Mb/s Soft-Output Viterbi Decoder," by Yeo et al., *IEEE Journal of Solid-State Circuits*, Vol. 38, No. 7, pp. 1234-1241, July 2003, and "High-Speed VLSI Architectures for Soft-Output Viterbi Decoding," by O. Joeressen et al., *International Conference on Application Specific Array Processors*, pp. 373-384, 1992, both of which are hereby incorporated by reference in their entirety.

For many low-power applications, a VD implementing the TB algorithm cannot tolerate the long latency inherent in the algorithm. It is therefore desirable to provide a VD implementing the RE algorithm but with lower power dissipation.

SUMMARY OF THE INVENTION

In one embodiment of the invention, an apparatus, such as a disk drive read channel or digital receiver, includes a Viterbi decoder that has first and second memories that store survivor state data of the decoder, an equality detector, first and second FIFO memories, and a multiplexer. The first memory has an input and an output, the second memory has an input and an output, the input of the second memory coupling to the output of the first memory. The equality detector has an output and an input, the input coupling to the output of the first memory. The first FIFO memory has an input and an output, the input couples to the output of the equality detector. The second FIFO memory has an input and an output, the input coupling to the input of the second memory. The first multiplexer has two inputs, a select input, and an output, a first one of the two inputs couples to the output of the second FIFO, a second one of the two inputs couples to the output of the second memory, and the select input couples to the output of the first FIFO. The output of the first multiplexer is an output of the Viterbi decoder.

In an alternative embodiment, a method for decoding a signal using a Viterbi decoder, comprising the steps of: sequentially shifting survivor state data samples through a first memory to a multi-bit output thereof; sequentially shifting the survivor state data samples from the output of the first memory through a second memory to a multi-bit output thereof; comparing a survivor state data sample at the multi-bit output of the first memory to determine if all the bits have a single value, storing the results of the comparing step and a value of one of the bits of the multi-bit output of the first memory in a FIFO; selectively inhibiting the shifting of the data though the second memory each data sample having bits with the same value; and, selecting, for a given data sample, either a selected bit of the multi-bit output of the second memory or the stored value in the FIFO as a Viterbi decoded data output, depending on the stored comparing step result. The data in the first and second memories and the FIFO are shifted at the same predetermined rate.

BRIEF DESCRIPTION OF THE DRAWINGS

The invention will be more clearly understood from the following description of some embodiments thereof, given by way of example only, with reference to the accompanying drawings; in which.

Like reference numbers are used throughout the figures to indicate like features. Individual features in the figures may not be drawn to scale.

DETAILED DESCRIPTION

For purposes of this description and unless explicitly stated otherwise, each numerical value and range should be interpreted as being approximate as if the word "about" or "approximately" preceded the value of the value or range.

Further, reference herein to "one embodiment" or "an embodiment" means that a particular feature, structure, or characteristic described in connection with the embodiment can be included in at least one embodiment of the invention. The appearances of the phrase "in one embodiment" in various places in the specification are not necessarily all referring to the same embodiment, nor are separate or alternative embodiments necessarily mutually exclusive of other embodiments. The same applies to the term "implementation."

Figure 1:
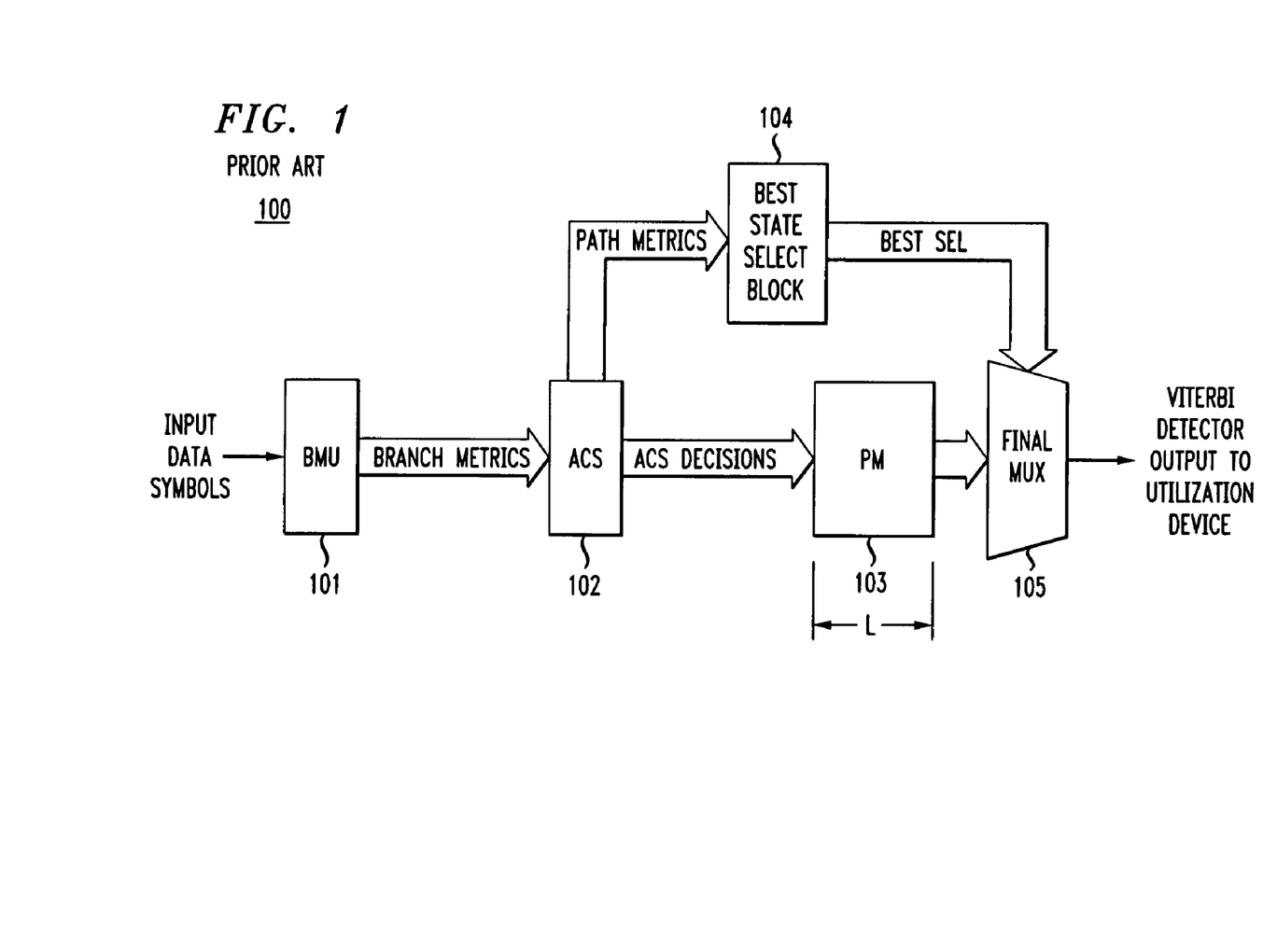
FIG. 1 schematically illustrates a Viterbi decoder implemented using the RE architecture.

FIG. 1 illustrates a conventional "hard decision" VD 100 implemented using the RE architecture. As described in more detail in "Reconfigurable Viterbi Decoder for Mobile Platform," by Rasheed, et al., *The 7th IFIP International Conference on Mobile and Wireless Communications Networks*, Morocco, 2005, (hereby incorporated by reference in its entirety) and the above-referenced paper by Joeressen, et al., the decoder 100 comprises a Branch Metric Unit (BMU) 101 which takes received convolutionally encoded data symbols and computes the "distance" (metric) between an ideal symbol and the received symbol based on the code used. The metric is then processed by add-compare-select (ACS) unit 102 to compute both the path metrics for the received symbols and the survivor data for each received symbol. The survivor data is stored in Path Memory (PM) 103 (described in more detail below). The path metrics are processed by Best State Select Block 104 which determines the most likely trellis output node in the PM 103 having the correct data value. A multiplexer 105, controlled by block 104, selectively couples one of $2^{K-1}$ output nodes from PM 103 as the output of the VD 100, where K is a value related to the convolutional code used or, in the case of data detection, K is chosen so that the VD 100 provides a maximum predetermined bit error rate for a given input signal signal-to-noise ratio, as discussed in more detail below.

Figure 2:
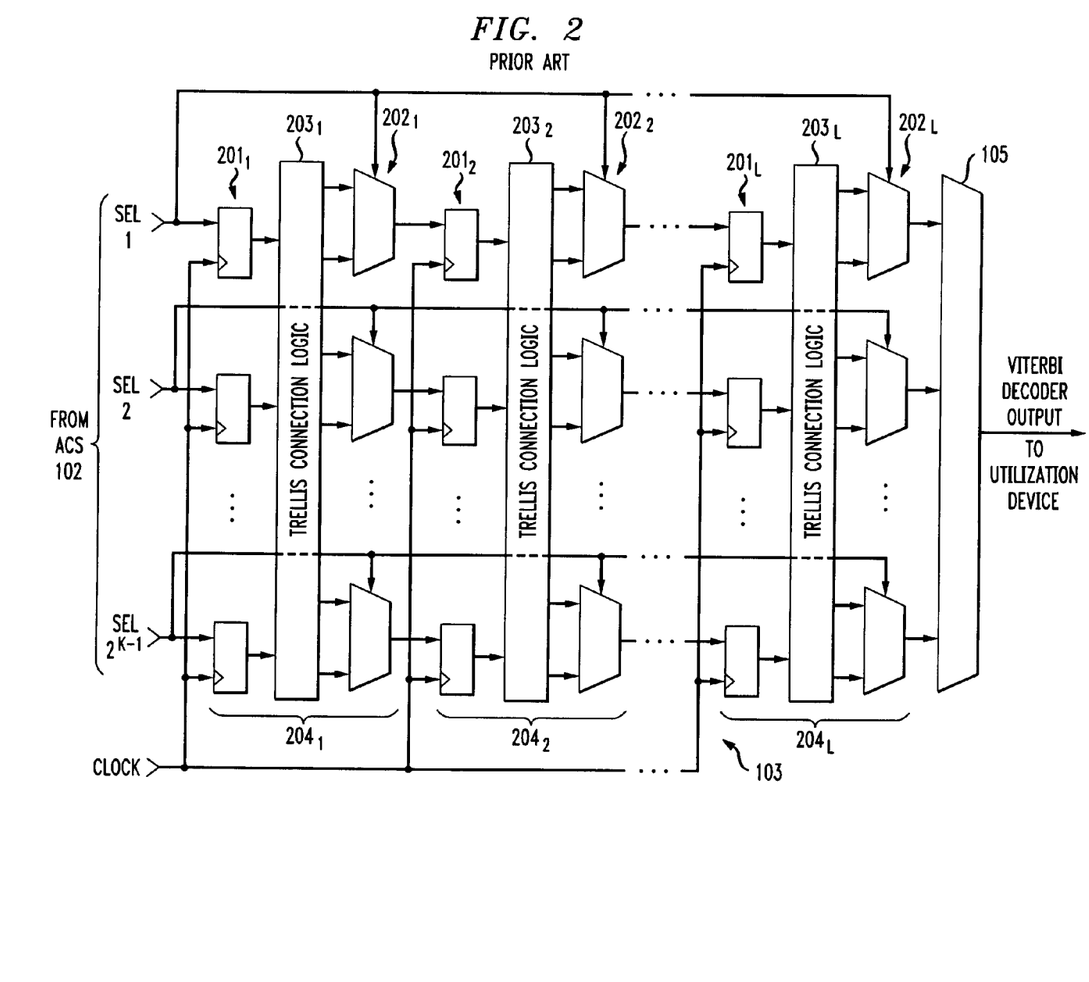
FIG. 2 is a simplified diagram of a path memory in FIG. 1.

FIG. 2 is a simplified diagram of a conventional PM 103 for the RE architecture illustrated in FIG. 1. The PM 103 comprises columns of commonly clocked registers $201_1$-$201_L$, L being the depth of the PM 103. Each column $201_1$-$201_L$ has a width of $2^{K-1}$ one-bit registers. In addition to the $2^{K-1}$ bit-wide columns of registers $201_1$-$201_L$, there are corresponding columns of two-input multiplexers $202_1$-$202_L$ controlled by ACS 102 (FIG. 1) via inputs $SEL_1$-$SEL_2^{K-1}$. Inputs to a given multiplexer come from the immediately preceding columns of registers by corresponding trellis connection logic blocks $203_1$-$203_L$. As is known in the art, interconnections within the logic blocks $203_1$-$203_L$ replicate the trellis structure of a convolutional code. A selected one of the outputs from the final set of multiplexers $202_L$ are selectively coupled to the output of the VD 100 by multiplexer 105, as described above.

The combination of corresponding, like-subscripted, columns of registers $201_1$-$201_L$, multiplexers $202_1$-$202_L$, and connection logic $203_1$-$203_L$, together comprise a stage $204_1$-$204_L$ of the VD 100 (e.g., $201_2$, $202_2$, and $203_2$, form stage $204_2$), each stage performing a step of the VA with each clock cycle. Thus, in this example, there are L stages in the VD 100. As is understood by those with ordinary skill in the art, the depth of the PM 103, here L, is greater than or equal to 5K, K being the constraint length of the convolutional code used to encode the data. Further, the width of the columns $201_1$-$201_L$, here $2^{K-1}$ bits, is the number of possible trellis states in the VA.

Figure 3:
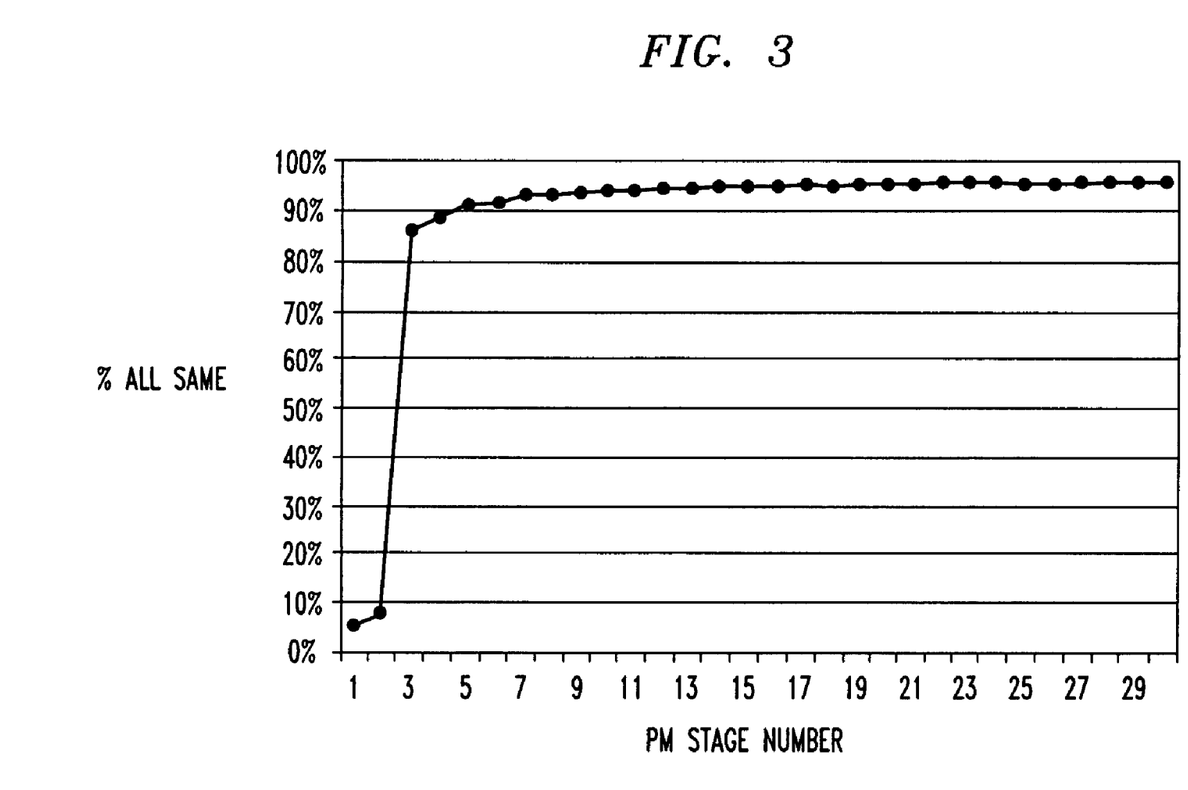
FIG. 3 is a plot illustrating simulation results for the decoder of FIGS. 1 and 2, operating as part of an exemplary mass-storage read channel; and, FIG. 4 is a simplified diagram of a path memory according to one exemplary embodiment of the invention.

FIG. 3 illustrates the results of repeated simulations of the VD 100 shown in FIGS. 1 and 2, the VD 100 implemented as an enhanced partial response class-4 (EPRC4) channel detector for detecting symbols written on a hard disk in a mass-storage system. The simulated 32-state VD 100 (K=6) is used to perform maximum likelihood sequence estimation on signals "read" from a simulated hard disk as shaped by a EPR4 equalization filter followed by a noise predictive finite-impulse response filter. For a more detailed explanation of how the VA is used in read-channel applications, please refer to the second above-referenced article by G. Forney, Jr., and "Advanced Read Channels for Magnetic Disk Drives," by Howell et al., *IEEE Transactions on Magnetics*, Vol. 30, No. 6, pp. 3807-3812, November 1994, hereby incorporated by reference in its entirety. For each simulation, the VD 100 is fed the symbols "read" from a hypothetical mass-storage system after the above-stated equalization and noise predictive filters, the symbols having been subjected to the typical distortions, inter-symbol interference, and noise of a typical mass-storage system. The plots shows the percentage of the time that all the output bits of a given stage $204_1$-$204_L$ in the PM 103 have converged the same value (referred to herein as the data sample converging to a single or the same value), here up to L=30. In this example, for the sixth stage, $204_6$ and beyond, all of the output bits have the same value more than 90% of the time. Once the output bits from a given stage have the same value, the value does not change as the data sample passes further through the PM 103. Thus, for 90% of the received symbols, processing the data samples beyond six levels deep in the PM 103 results in no further advantage. However, for the remaining 10% of the received symbols, further processing is needed. Moreover, while it may be tempting to take the data value from the output of the sixth stage as the output of the VD 100, there may be earlier-received symbol data still being processed in deeper levels within the PM 103, which may result in data being decoded out of order. At the same time, further processing of symbol data that has converged to a single value wastes power since the data continues to be passed through the PM 103 by clocking all the remaining registers until reaching multiplexer 105 and passed out of the VD 100.

Figure 4:
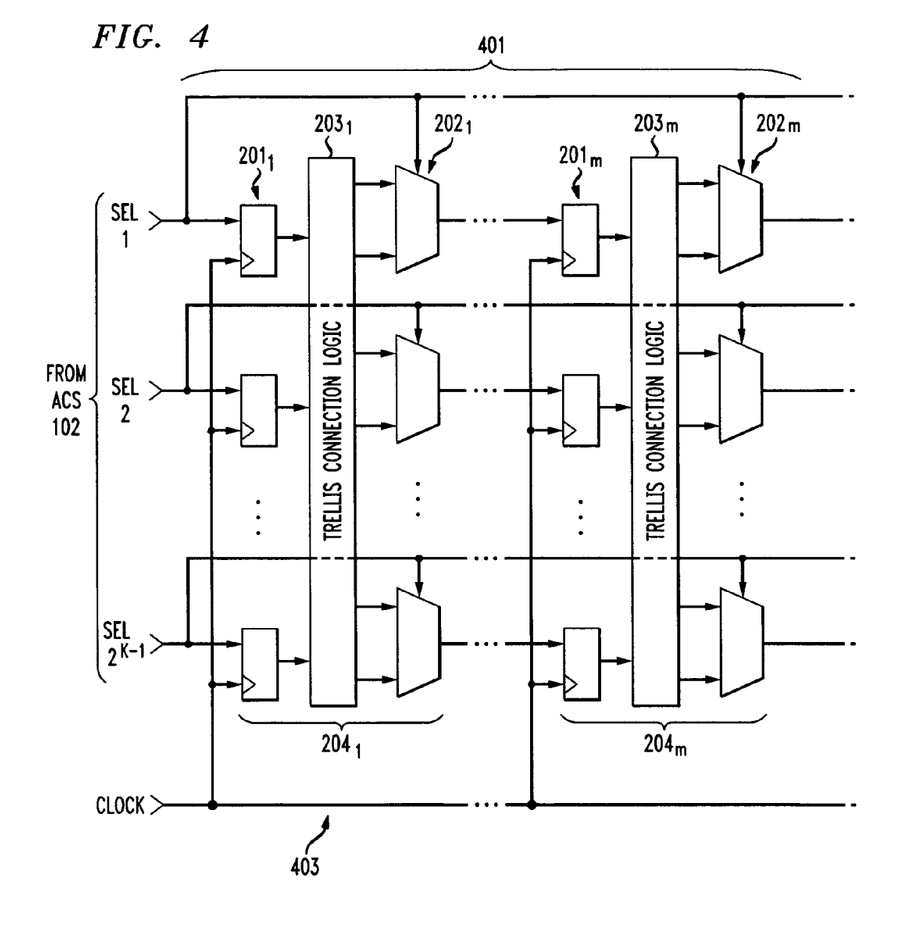

Briefly and in accordance with the invention, to reduce the power consumption of the VD 100, the clock signal to register columns in PM 103 are selectively disabled when a data sample in a preceding stage has converged to a single value. As illustrated in FIG. 4, an exemplary embodiment of the PM 403 has essentially the same structure as the PM 103 shown in FIG. 2 but is partitioned into two sections 401 and 402, although more than one partition may be used. The sum of the depths of partition 401 (M stages) and partition 402 (N stages), is preferably L stages, as discussed above in connection with FIGS. 1 and 2. The depth of partition 401, here from stage $204_1$ to $204_M$, is chosen so that for a desirable percentage of the time all the output bits from the stage $204_M$ in the partition 401 have the same value. Using the example illustrated in FIG. 3, if the desired percentage is 90% or more, then M=6. The outputs of the multiplexer $202_M$ in stage $204_M$ couple to an equality detector 405, which detects if all the output bits of the stage $204_M$ have the same value, i.e., either all ones or all zeros. First-in-first-out (FIFO) memories 406 and 407 are clocked by the same clock (CLOCK) for the register columns in partition 402 and have the same number of cells in each as there are columns of registers in partition 402, i.e., the depth of FIFOs 406 and 407 are the same as the depth of partition 402, thereby keeping the data flowing through the FIFOs 406, 407 synchronized with data still being processed in the partition 402. In this embodiment, FIFO 406 keeps track of which instances of data in the partition 402 have converged to a single value and FIFO 407 keeps track of what the corresponding value is. For each instance where the data converged to a single value, a cell in the FIFO 406 is a "one," thereby gating off, or disabling, the clock signal CLOCK from being applied to the corresponding subsequent register column in partition 402 by gates 408. Note that for register column $201_{M+1}$, the gating of the clock signal CLOCK thereto is controlled by the output of detector 405, whereas for subsequent register columns $201_{M+2}$-$201_L$, the gating is controlled by outputs from the FIFO 406.

Optional multiplexer 409 selects as input to FIFO 407 either 1) the value of any one of the $2^{K-1}$ output bits of stage $204_M$ if all the output values of stage $204_M$ are all of a single value as detected by detector 405, or 2) the previously loaded data value in the FIFO 407 if all the output values of stage $204_M$ are not of single value. The "recycling" of a previous value from the FIFO 407 is a technique to reduce power consumption by minimizing transitions of the cells in FIFO 406 as it is clocked. However, it is understood that multiplexer 409 may be removed and the input to FIFO 407 come directly from any one of the $2^{K-1}$ outputs of stage $204_M$.

Multiplexer 105 operates substantially the same as described in connection with FIGS. 1 and 2. As shown, multiplexer 105 selects one of $2^{K-1}$ outputs from PM 403 to produce a one-bit output. Multiplexer 410, under control of the output of FIFO 406, selectively couples as the output of VD 100 either the output of multiplexer 105 or the output of FIFO 407.

Operation of the partition 401 of PM 403 is substantially the same as the first M stages of PM 103, discussed above. For data passing from stage $204_M$ into partition 402 that are not all of a single value (e.g., are not all "zero" or not all "one" in this example), further processing of that data operates substantially the same as the PM stages of PM 103, discussed above. However, for each instance or sample of survivor data from stage $204_M$ having values that are all the same (e.g., are all "zero" or "one" in this example), then no further processing of that data sample is needed and the subsequent register columns $201_{M+1}$-$201_L$ do not need to be clocked for that data sample. In this case, the FIFOs keep track of the data value in the proper order and selectively disable the corresponding subsequent register columns in partition 402. Thus, a mix of data can be simultaneously passing through partition 402 and through the FIFOs 406, 407 and all the data remains in the proper order when read out from the VD 100 with each cycle of CLOCK.

In the disclosed embodiment, FIFOs 406, 407 are shown as separate FIFOs, whereas it is understood by those skilled in the art that the two FIFOs may be considered as a single two-bit wide FIFO. Moreover, a skilled artisan may implement the columns of registers $201_1$-$201_L$ in a fast memory and control the reading and writing of the memory in accordance with the invention. In such an embodiment, the partitions 401, 402 may be implemented in separate memories or by logically partitioning one memory into two or more partitions 401, 402. Further, while the invention is shown implemented as part of an RE architecture, other approaches to VD designs, such as certain combined TB and RE architectures, may advantageously implement the invention. Further, the invention is also applicable to Viterbi decoders that include a "soft-output" in addition to the data output discussed above (referred to generally as SOVA), as described in several of the above-cited references.

It will be further understood that various changes in the details, materials, and arrangements of the parts which have been described and illustrated in order to explain the nature of this invention may be made by those skilled in the art without departing from the scope of the invention as expressed in the following claims.

The use of figure numbers and/or figure reference labels in the claims is intended to identify one or more possible embodiments of the claimed subject matter in order to facilitate the interpretation of the claims. Such use is not to be construed as necessarily limiting the scope of those claims to the embodiments shown in the corresponding figures.

The invention claimed is:

1. An apparatus having a Viterbi decoder, comprising:
a first memory having an input and an output;
a second memory having an input and an output, the input coupling to the output of the first memory;
an equality detector having an output and an input, the input coupling to the output of the first memory;
a first FIFO memory having an input and an output, the input coupling to the output of the equality detector;
a second FIFO memory having an input and an output, the input coupling to the input of the second memory; and
a first multiplexer having two inputs, a select input, and an output, a first one of the two inputs coupling to the output of the second FIFO, a second one of the two inputs coupling to the output of the second memory, and the select input coupling to the output of the first FIFO;
wherein the first and second memories are adapted to store survivor state data, and the output of the first multiplexer is an output of the Viterbi decoder.

2. The apparatus of claim 1, further comprising:
a second multiplexer having two inputs, a select input coupling to the output of the equality detector, and an output coupling to the input of the second FIFO memory, one of the two inputs coupling to the input of the second memory, the other input coupling to an additional output of the second FIFO memory.

3. The apparatus of claim 1, wherein the first and second FIFO memories are implemented in a random access memory.

4. The apparatus of claim 1, wherein the apparatus is a mass-storage system.

5. The apparatus of claim 1, wherein the apparatus is a digital receiver.

6. The apparatus of claim 1, wherein the first FIFO and the second FIFO each comprise an equal number of series-coupled cells.

7. The apparatus of claim 6, wherein each of the inputs and outputs of the first and second memories are multi-bit, the number of bits of the multi-bit inputs and outputs being the same as the number of survivor state in the survivor state data, and the equality detector indicates to the output thereof if all the output bits of the first memory are of a single value.

8. The apparatus of claim 7, wherein the one value is either a "zero" or a "one."

9. The apparatus of claim 7, further comprising:
a best-state selection circuit; and,
an additional multiplexer, disposed between the multi-bit output of the second memory and the first multiplexer, coupling one of the outputs of the second memory to the second input of the first multiplexer in response to the best-state selection circuit.

10. The apparatus of claim 9, wherein the best-state selection circuit has as many outputs as survivor states, the outputs thereof controlling the coupling by the additional multiplexer.

11. The apparatus of claim 6, wherein the second memory comprises columns of multi-bit registers, each register having a clock input, and the number of registers being the same as the number of cells of the first FIFO memory.

12. The apparatus of claim 11, further comprising:
clock gating circuitry which selectively gates clock signals to the registers in the second memory.

13. The apparatus of claim 6, wherein the first memory and the second memory are random access memories arranged in rows and columns, the number of memory columns in the second memory being the same as the number of cells in the first FIFO memory, and the number of rows being the same as the number of survivor states in the survivor state data.

14. The apparatus of claim 13, wherein a single random access memory is logically partitioned into the first and second memories.

15. An apparatus comprising a Viterbi decoder, comprising:
- an L1 columns deep first shift-register memory having a Y multi-bit input and a Y multi-bit output;
- an L2 columns deep second shift-register memory having a Y multi-bit input and a Y-multi-bit output, the input coupling to the output of the first shift-register memory, each column having a clock input;
- an equality detector having a Y multi-bit input coupling to the output of the first shift-register memory, for producing at an output a signal indicating if the output bits of the first shift-register memory are of a single value;
- an L2-cell deep first FIFO memory, with the cells arranged first to last, having an input and L2 outputs, one output for each cell, the input coupling to the output of the equality detector;
- an L2-cell deep second FIFO memory with the cells arranged first to last, having an input and an output, the input coupling to one bit of the Y multi-bit input of the second shift-register memory, the output coming from the last cell;
- a best-state selection circuit;
- a first multiplexer having two inputs, a select input, and an output, a first one of the two inputs coupling to the output of the second FIFO, the select input coupling to the output coming from the last cell of the first FIFO;
- a second multiplexer, responsive to the best-state selection circuit, for coupling one bit of the Y multi-bit output of the second shift-register memory to a second one of the two inputs of the first multiplexer;
- clock gating circuitry which selectively gates clock signals to the columns in the second shift-register;
- wherein the first and second shift-register memories are adapted to store survivor data, the clock gating circuitry selectively gates clock signals to the columns in the second shift-register memory in response to corresponding outputs of the first FIFO memory, and the output of the first multiplexer is an output of the Viterbi decoder.

16. The apparatus of claim 15, wherein the apparatus is a mass-storage system.

17. The apparatus of claim 15, wherein the apparatus is a digital receiver.

18. The apparatus of claim 15, wherein the second FIFO memory has at least one additional output, the apparatus further comprising:
- a third multiplexer having two inputs, a select input coupling to the output of the equality detector, and an output coupling to the input of the second FIFO memory, one of the two inputs coupling to one bit of the Y multi-bit input of the second memory, the other input coupling to the at least one additional output of the second FIFO memory.

19. The apparatus of claim 18, wherein the at least one additional output of the second FIFO memory comes from the first cell in the memory.

20. A method of decoding a signal using a Viterbi decoder, comprising the steps of:
- sequentially shifting, at a predetermined rate, survivor state data samples through a first memory to a multi-bit output thereof;
- sequentially shifting, at the predetermined rate, the survivor state data samples from the output of the first memory through a second memory to a multi-bit output thereof;
- comparing a survivor state data sample at the multi-bit output of the first memory to determine if all the bits have a single value;
- storing the results of the comparing step and a value of one of the bits of the multi-bit output of the first memory in a FIFO having two outputs;
- selectively inhibiting the shifting of the data though the second memory each data sample having bits with the same value; and,
- selecting, for a given data sample, either a selected bit of the multi-bit output of the second memory or the stored value in the FIFO as a Viterbi decoded data output, depending on the stored comparing step result;
- wherein data in the FIFO is shifted at the predetermined rate.

21. The method of claim 20, wherein in the selecting step, the selected bit of the multi-bit output of the second memory is determined by a best-state selection circuit.

22. The method of claim 20, the step of storing further comprises the step of:
- storing in the FIFO either 1) the value of one of the bits of the multi-bit output of the first memory if the comparing step result is that all the bits are of a single value, otherwise 2) a value already in the FIFO, depending on the comparing step.

23. The method of claim 22, wherein the value already in the FIFO is a value stored in response to an immediately preceding storing step.

24. The method of claim 23, wherein the survivor state samples are multi-bit, the number of bits being the same as the number of states in the survivor-state data.

* * * * *